(12) United States Patent
Ha et al.

(10) Patent No.: US 7,951,643 B2
(45) Date of Patent: May 31, 2011

(54) INTEGRATED CIRCUIT PACKAGING SYSTEM WITH LEAD FRAME AND METHOD OF MANUFACTURE THEREOF

(75) Inventors: Jong-Woo Ha, Seoul (KR); TaeWoo Kang, Suwon-si (KR); DongSoo Moon, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/325,193

(22) Filed: Nov. 29, 2008

(65) Prior Publication Data
US 2010/0133665 A1    Jun. 3, 2010

(51) Int. Cl.
*H01L 21/00* (2006.01)
(52) U.S. Cl. ........ 438/106; 438/107; 438/123; 438/109; 438/121; 438/127; 257/676; 257/686; 257/787
(58) Field of Classification Search .......... 438/106–127; 257/787
See application file for complete search history.

(56) References Cited

U.S. PATENT DOCUMENTS

| | | | |
|---|---|---|---|
| 7,034,386 B2 | 4/2006 | Kurita | |
| 7,259,445 B2* | 8/2007 | Lau et al. | 257/675 |
| 7,381,593 B2* | 6/2008 | Ararao et al. | 438/123 |
| 7,476,962 B2* | 1/2009 | Kim | 257/686 |
| 7,719,094 B2* | 5/2010 | Wu et al. | 257/666 |
| 2007/0273049 A1* | 11/2007 | Khan et al. | 257/787 |
| 2008/0105973 A1 | 5/2008 | Zhang et al. | |

* cited by examiner

*Primary Examiner* — Jarrett J Stark
*Assistant Examiner* — Wilner Jean Baptiste
(74) *Attorney, Agent, or Firm* — Mikio Ishimaru

(57) ABSTRACT

A method of manufacture of an integrated circuit packaging system includes: providing a base substrate; attaching a base device over the base substrate; attaching a leadframe having a leadframe pillar adjacent the base device over the base substrate; applying a base encapsulant over the base device, the base substrate, and the leadframe; and removing a portion of the base encapsulant and a portion of the leadframe providing the leadframe pillar partially exposed.

20 Claims, 5 Drawing Sheets

INTEGRATED CIRCUIT PACKAGING SYSTEM WITH LEAD FRAME AND METHOD OF MANUFACTURE THEREOF

TECHNICAL FIELD

The present invention relates generally to an integrated circuit packaging system, and more particularly to a system for integrated circuit packages with lead frames.

BACKGROUND ART

Chips of the electronic variety are also known as integrated circuit devices. Modern life as we know has been affected in virtually all aspects by tiny chips with integrated circuits. We often take for granted or do not realized that from the smallest cell phone to the heavy equipment for manufacturing aircraft, chips are part of how things get done.

The demands for electronic devices with integrated circuits increasingly require more functions with faster response in reduced dimensions and at lower prices. These high performance devices often demand all of lighter, faster, smaller, multi-functional, highly reliable, and lower cost.

In efforts to meet such requirements, improvements have been attempted in many aspects of electronic product development such as producing smaller and less expensive semiconductor chips. Unfortunately, this development is still not enough to satisfy the demands. Every aspect including packaging can contribute.

Numerous technologies have been developed to meet these requirements. Some research and development focused on new package technologies while others focused on improving existing and mature package technologies. Research and development in package technologies may include a seemingly endless number of different approaches.

One proven way to reduce cost is to use package technologies with existing manufacturing methods and equipments. Paradoxically, the reuse of existing manufacturing processes does not typically result in the reduction of package size. Existing packaging technologies struggle to cost effectively meet demands of today's integrated circuit packages.

Commonly used integrated circuit or semiconductor device methodologies for packaging often use substrates for stacking integrated circuit devices. Stacking requires connection patterns of input and output elements such as leads, posts, wires, or other conductors connecting the integrated circuit device.

Of course, the requirement of additional material including a substrate undesirably increases the thickness and cost of fabricating the package. Moreover, the use of additional substrate material may undesirably increase the manufacturing cycle time, which can also increase cost.

Despite the advantages of recent developments in semiconductor fabrication and packaging techniques, there is a continuing need for improving electronic device size, performance, reliability, and manufacturing.

Thus, a need still remains for an integrated circuit packaging system with improved manufacturing processes and materials. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate; attaching a base device over the base substrate; attaching a leadframe having a leadframe pillar adjacent the base device over the base substrate; applying a base encapsulant over the base device, the base substrate, and the leadframe; and removing a portion of the base encapsulant and a portion of the leadframe providing the leadframe pillar partially exposed.

The present invention provides an integrated circuit packaging system including: a base substrate; a base device over the base substrate; a leadframe pillar, having characteristics of a portion of a leadframe being removed, adjacent the base device over the base substrate; and a base encapsulant over the base device, the base substrate, and the leadframe pillar partially exposed.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
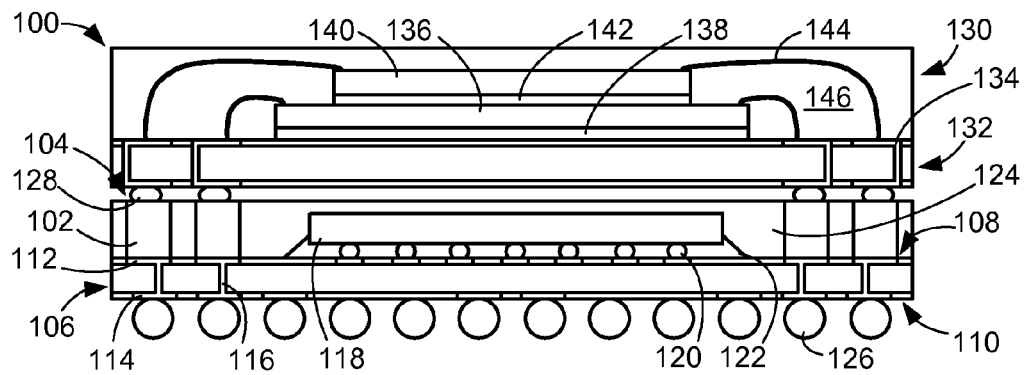
FIG. 1 is a cross-sectional view of an integrated circuit packaging system taken along lines 1-1 of FIG. 3 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Figure 3:
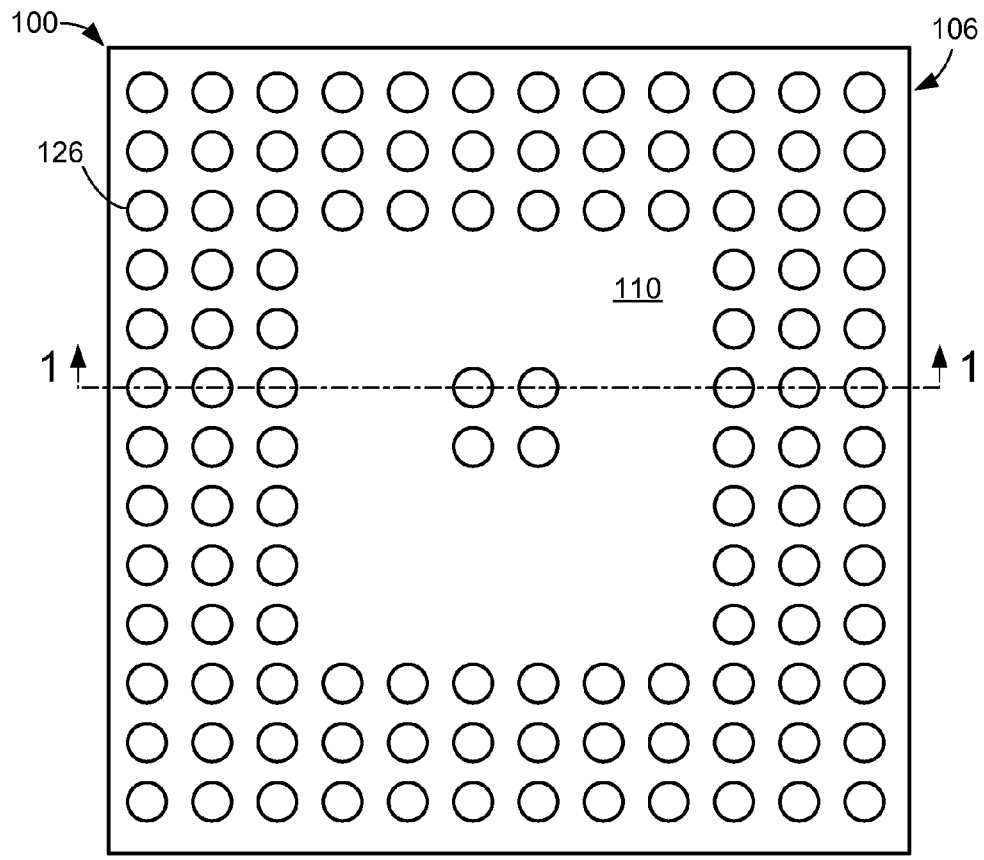
FIG. 3 is a bottom plan view of the integrated circuit package.

Referring now to FIG. 1, therein is shown a cross-sectional view of an integrated circuit packaging system 100 taken along lines 1-1 of FIG. 3 in a first embodiment of the present invention. The integrated circuit packaging system 100 preferably includes a leadframe pillar 102 having a leadframe pillar top 104. The end opposite the leadframe pillar top 104 of the leadframe pillar 102 can be attached or mounted over a base substrate 106.

The base substrate 106 can include a base top side 108 and a base bottom side 110. Top connection regions 112 can be formed on or adjacent the base top side 108. Similarly, bottom connection regions 114 can be formed on or adjacent the base bottom side 110. Base substrate interconnects 116 can provide electrical connectivity between the top connection regions 112 or the bottom connection regions 114 or any combination thereof.

A base device 118 such as an integrated circuit, passive device, or package can be attached or mounted over the base substrate 106. Base device connectors 120 can provide electrical connectivity through the top connection regions 112, the base substrate interconnects 116, or the bottom connection regions 114 of the base substrate 106. A base attachment layer 122 such as a fill, adhesive, or film can be formed between the base device 118 and the base top side 108 of the base substrate 106.

A base encapsulant 124 can be formed over the device, a portion of the leadframe pillar 102, and a portion of the base substrate 106. Components can be covered and protected by the base encapsulant 124 that can also provide structural integrity particularly with respect to the leadframe pillar 102. The base encapsulant 124 can provide the leadframe pillar top 104 of the leadframe pillar 102 substantially exposed above the base device 118.

Base substrate connectors 126 such as solder balls, solder bumps, or other conductor can be formed over the base bottom side 110 of the base substrate 106. The base substrate connectors 126 can be attached or mounted on the bottom connection regions 114 to provide electrical connectivity to a next level system such as another package or printed circuit board.

A package interconnect 128 such as a solder ball, solder bump, or other conductor can provide electrical connectivity to the leadframe pillar 102 and an electrical component 130 such as a stack package. The electrical component 130 can be attached or mounted over the leadframe pillar 102 providing connectivity to the base device 118 or the base substrate 106.

The electrical component 130 can include a stack substrate 132 having a stack substrate conductor 134 for electrically connectivity through the stack substrate 132. The stack substrate conductor 134 can be formed on or near a side of the stack substrate 132 for electrically connecting traces or components. The stack substrate conductor 134 can also be formed between sides of the stack substrate 132.

A first stack device 136 can be attached or mounted over the stack substrate 132 with a first stack mounting material 138. Similarly, a second stack device 140 can be attached or mounted over the first stack device 136 with a second stack mounting material 142. The first stack mounting material 138 and the second stack mounting material 142 can be the same or different material.

Stack device connectors 144 can electrically connect the first stack device 136 or the second stack device 140 to one another or the stack substrate 132. The stack device connectors 144 can provide electrical connectivity through the stack substrate 132 to the leadframe pillar 102 and thereby the base device 118 or a next level system.

A stack encapsulant 146 can cover or protect the first stack device 136, the second stack device 140, the stack device connectors 144, or portions of the stack substrate 132. The stack encapsulant 146 can be the same or different material as the base encapsulant 124.

For illustrative purposes, the electrical component 130 is shown attached and connected to the leadframe pillar 102 although it is understood that any component can be attached or connected to the leadframe pillar 102.

It has been discovered that the present invention with the leadframe pillar 102 having the leadframe pillar top 104 can improve warpage and numbers of inputs or outputs. It has been unexpectedly found that existing manufacturing techniques can improve manufacturing throughput and costs as well as provide improved structural integrity particularly during processing.

Thus, it has been discovered that the integrated circuit packaging system of the present invention furnishes important and heretofore unknown and unavailable solutions, capabilities, and functional aspects for improving warpage, numbers of inputs or outputs, manufacturing throughput, costs, or structural integrity.

Figure 2:
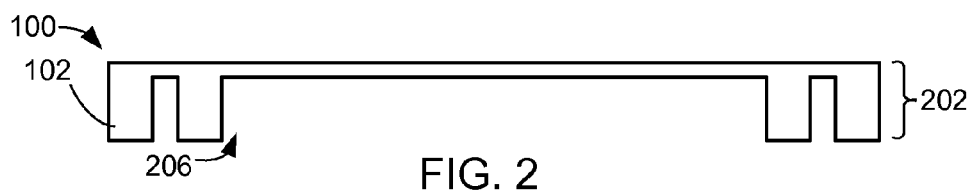
FIG. 2 is a cross-sectional view of the structure of FIG. 1 in an interposer phase.

Referring now to FIG. 2, therein is shown a cross-sectional view of the structure of FIG. 1 in an interposer phase. The integrated circuit packaging system 100 preferably includes a leadframe 202 such as an interposer including the leadframe pillar 102. A cavity 206 can be formed to provide spacing for the base device 118 of FIG. 1 or other component.

The leadframe 202 can be attached or mounted on the base substrate 106 of FIG. 1 and over the base device 118 and having the leadframe pillar 102 adjacent or next to the base device 118. The leadframe pillar 102 can preferably be substantially vertical and substantially perpendicular to the base substrate 106 to provide electrical connectivity from the base top side 108 to a location above the base device 118.

For illustrative purposes, two sets of the leadframe pillar 102 are shown although it is understood that any number, row, column, or configuration of the leadframe pillar 102 may be used.

Referring now to FIG. 3, therein is shown a bottom plan view of the integrated circuit packaging system 100. The integrated circuit packaging system 100 preferably includes the base bottom side 110 of the base substrate 106 having the base substrate connectors 126 thereover.

The base substrate connectors 126 can be formed on or over the base bottom side 110 or the base substrate interconnects 116 of FIG. 1 to provide electrical connectivity to the base substrate 106 and thereby the leadframe pillar 102 or the base device 118.

For illustrative purposes, the base substrate connectors 126 are shown in an array having three rows along each edge of the base substrate 106 although it is understood that any number, row, column, or configuration of the base substrate connectors 126 may be used.

Figure 4:
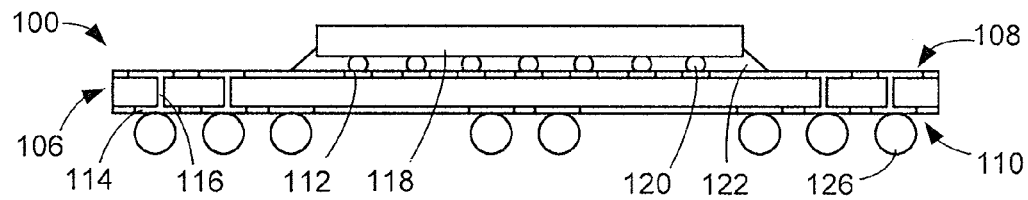
FIG. 4 is a cross-sectional view of the integrated circuit packaging system in an interconnection phase.

Referring now to FIG. 4, therein is shown a cross-sectional view of the integrated circuit packaging system 100 in an interconnection phase. The integrated circuit packaging system 100 preferably includes the base device connectors 120 electrically connecting the base device 118 and the top connection regions 112 near the base top side 108 of the base substrate 106.

The base device 118 can be attached or mounted over the base top side 108 of the base substrate 106 with the base attachment layer 122. The base device 118 can be electrically connected through the top connection regions 112, the base substrate interconnects 116, and the bottom connection regions 114 to the base substrate connectors 126 formed over the base bottom side 110 of the base substrate 106.

Figure 5:
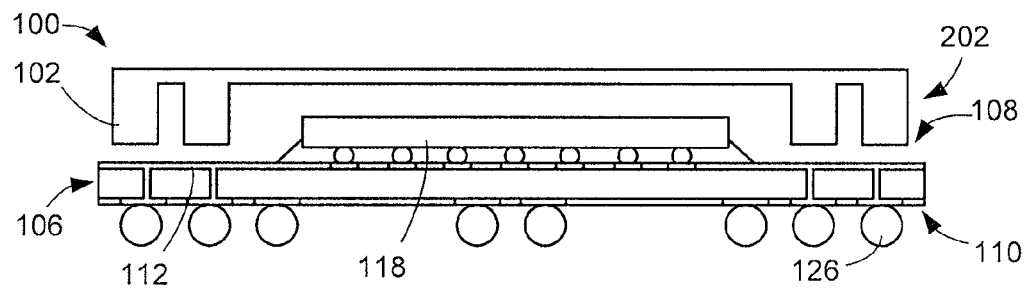
FIG. 5 is a cross-sectional view of the structure of FIG. 4 in an attachment phase.

Referring now to FIG. 5, therein is shown a cross-sectional view of the structure of FIG. 4 in an attachment phase. The integrated circuit packaging system 100 preferably includes the leadframe 202 attached or mounted over the base device 118 and the base top side 108 of the base substrate 106.

The leadframe 202 includes the leadframe pillar 102 electrically connected to the top connection regions 112 of the base substrate 106. The leadframe pillar 102 can provide electrical connectivity to the top connection regions 112 of the base substrate 106 and thereby the base device 118 or a next level system through the base substrate connectors 126.

Figure 6:
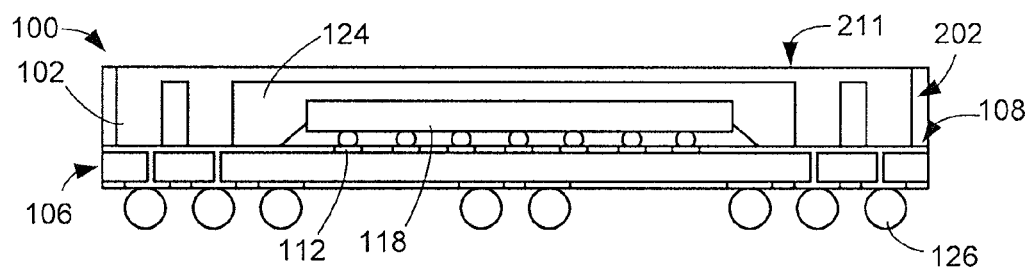
FIG. 6 is a cross-sectional view of the structure of FIG. 5 in an encapsulation phase.

Referring now to FIG. 6, therein is shown a cross-sectional view of the structure of FIG. 5 in an encapsulation phase. The integrated circuit packaging system 100 preferably includes the base encapsulant 124 formed over the base device 118, a portion of the leadframe 202, or a portion of the base substrate 106. The base encapsulant 124 can be co-planar with and extend beyond a perimeter of a leadframe top side 211 of the leadframe 202.

The base encapsulant 124 can provide structural integrity or substantially fixed positions for the leadframe pillar 102, portions of the leadframe 202, or the base device 118. The base encapsulant 124 can also cover or protect portions of the base top side 108 of the base substrate 106 including exposed portions of the top connection regions 112.

Figure 7:
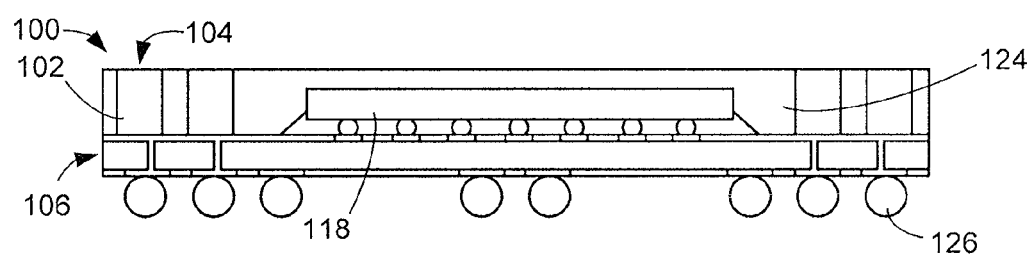
FIG. 7 is a cross-sectional view of the structure of FIG. 6 in a removal phase.

Referring now to FIG. 7, therein is shown a cross-sectional view of the structure of FIG. 6 in a removal phase. The integrated circuit packaging system 100 preferably includes the leadframe 202 of FIG. 6 partially removed and providing the leadframe pillar 102 with the leadframe pillar top 104.

The base encapsulant 124 can provide structural integrity or a substantially fixed position for the leadframe pillar 102 and the leadframe pillar top 104 substantially exposed. The leadframe pillar top 104 can provide connectivity to another component or package. The leadframe pillar 102 can be electrically connected to the base substrate 106 and thereby the base substrate connectors 126.

A portion of the leadframe 202 can be removed by a process such as grinding. A grinding process can remove a portion of the base encapsulant 124 and substantially all of a top portion of the leadframe 202 forming the leadframe pillar top 104 that has the physical characteristics of the leadframe 202 removed by a removal or grinding process and above upper extents or a top of the base device 118.

Figure 8:
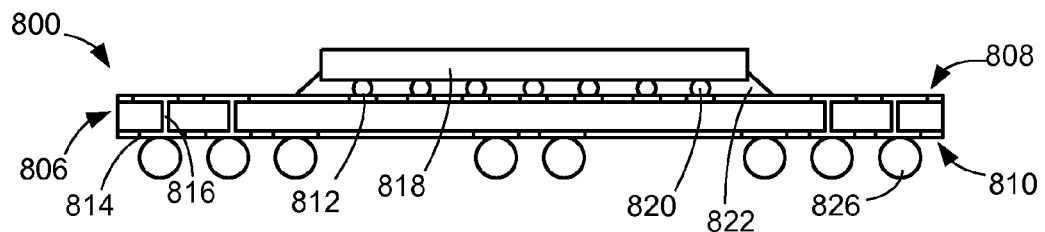
FIG. 8 is a cross-sectional view of an integrated circuit packaging system in an interconnection phase of a second embodiment of the present invention.

Referring now to FIG. 8, therein is shown a cross-sectional view of an integrated circuit packaging system 800 in an interconnection phase of a second embodiment of the present invention. The integrated circuit packaging system 800 preferably includes base device connectors 820 electrically connecting a base device 818 and top connection regions 812 near a base top side 808 of a base substrate 806.

The base device 818 can be attached or mounted over the base top side 808 of the base substrate 806 with a base attachment layer 822. The base device 818 can be electrically connected through the top connection regions 812, base substrate interconnects 816, and bottom connection regions 814 to base substrate connectors 826 formed over a base bottom side 810 of the base substrate 806.

Figure 9:
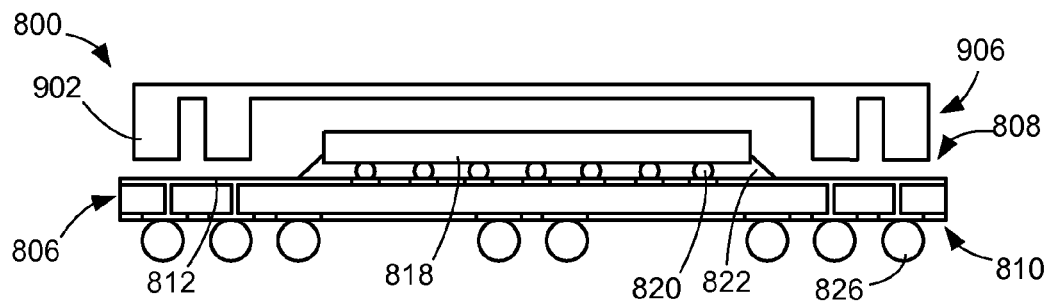
FIG. 9 is a cross-sectional view of the structure of FIG. 8 in an attachment phase.

Referring now to FIG. 9, therein is shown a cross-sectional view of the structure of FIG. 8 in an attachment phase. The integrated circuit packaging system 800 preferably includes a leadframe pillar 902 of a leadframe 906 such as an interposer attached or mounted over the base device 818 and the base top side 808 of the base substrate 806.

The leadframe 906 includes the leadframe pillar 902 electrically connected to the top connection regions 812 of the base substrate 806. The leadframe pillar 902 can provide electrical connectivity to the top connection regions 812 of the base substrate 806 and thereby the base device 818 or a next level system through the base substrate connectors 826.

Figure 10:
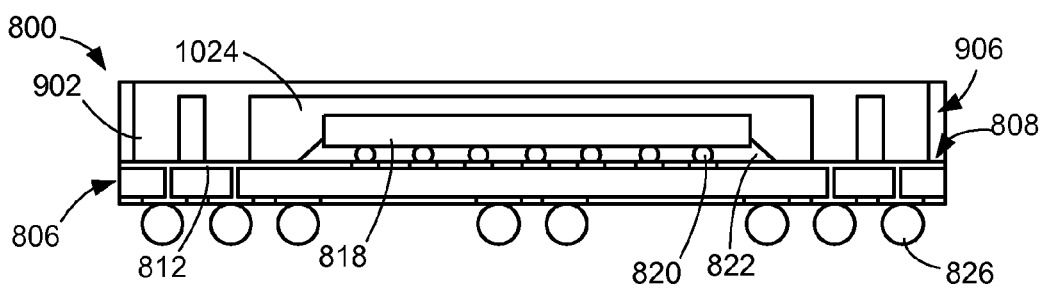
FIG. 10 is a cross-sectional view of the structure of FIG. 9 in an encapsulation phase.

Referring now to FIG. 10, therein is shown a cross-sectional view of the structure of FIG. 9 in an encapsulation phase. The integrated circuit packaging system 800 preferably includes a base encapsulant 1024 formed over the base device 818, a portion of the leadframe 906, or a portion of the base substrate 806.

The base encapsulant 1024 can provide structural integrity or substantially fixed positions for the leadframe pillar 902, a portion of the leadframe 906, or the base device 818. The base encapsulant 1024 can also cover or protect portions of the base top side 808 of the base substrate 806 including exposed portions of the top connection regions 812.

Figure 11:
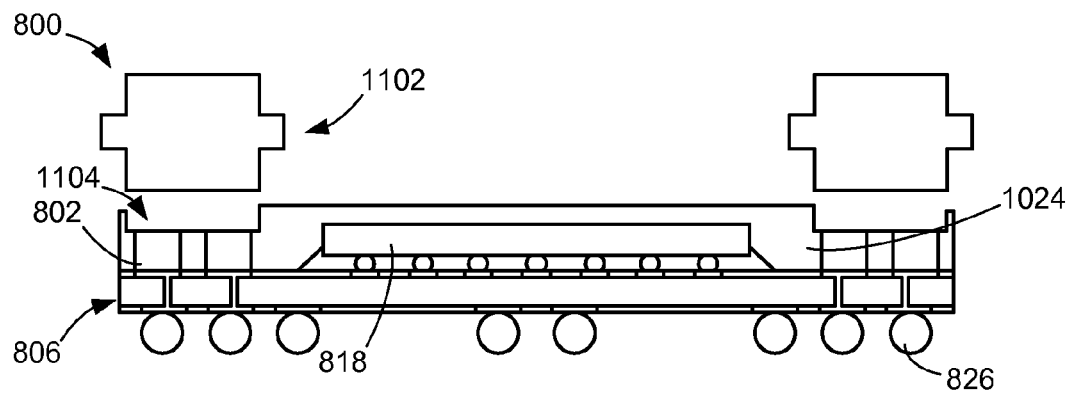
FIG. 11 is a cross-sectional view of the structure of FIG. 10 in a removal phase.

Referring now to FIG. 11, therein is shown a cross-sectional view of the structure of FIG. 10 in a removal phase. The integrated circuit packaging system 100 preferably includes the leadframe 906 of FIG. 10 without a portion of the leadframe 906 of FIG. 10 and providing the leadframe pillar 902 with a leadframe pillar top 1104.

The base encapsulant 1024 can provide structural integrity or a substantially fixed position for the leadframe pillar 902 and the leadframe pillar top 1104 substantially exposed. The leadframe pillar top 1104 can provide connectivity to another component or package. The leadframe pillar 902 can be electrically connected to the base substrate 806 and thereby the base substrate connectors 826.

A portion of the leadframe 906 can be removed by a removal apparatus 1102 such as a saw or other cutting device over a selective region. A selective sawing process can remove a portion of the base encapsulant 1024 and a portion of the leadframe 906 whereby the leadframe 906 or the leadframe pillar top 1104 has the physical characteristics of a portion of the leadframe 906 removed by a removal or selective sawing process. The leadframe pillar top 1104 can be below upper extents or a top of the base device 818.

Figure 12:
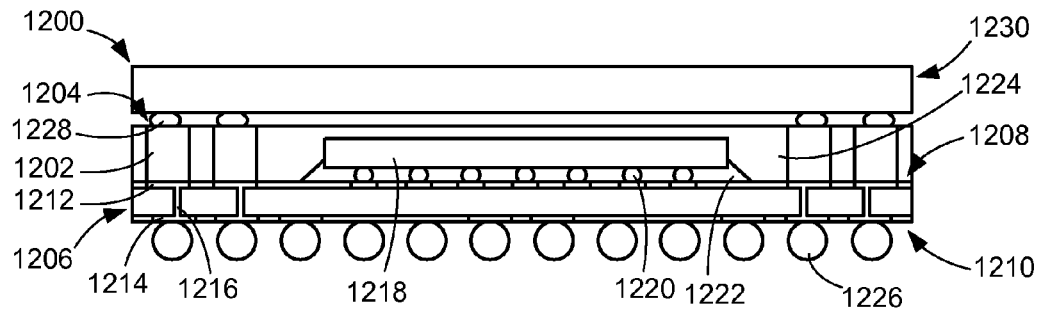
FIG. 12 is a cross-sectional view of an integrated circuit packaging system 1200 in a third embodiment of the present invention.

Referring now to FIG. 12, therein is shown a cross-sectional view of an integrated circuit packaging system 1200 in a third embodiment of the present invention. The integrated circuit packaging system 1200 preferably includes a leadframe pillar 1202 having a leadframe pillar top 1204. The end opposite the leadframe pillar top 1204 of the leadframe pillar 1202 can be attached or mounted over a base substrate 1206.

The base substrate 1206 can include a base top side 1208 and a base bottom side 1210. Top connection regions 1212 can be formed on or adjacent the base top side 1208. Similarly, bottom connection regions 1214 can be formed on or adjacent the base bottom side 1210. Base substrate interconnects 1216 can provide electrical connectivity between the top connection regions 1212 or the bottom connection regions 1214 or any combination thereof.

A base device 1218 such as an integrated circuit, passive device, or package can be attached or mounted over the base substrate 1206. Base device connectors 1220 can provide electrical connectivity through the top connection regions 1212, the base substrate interconnects 1216, or the bottom connection regions 1214 of the base substrate 1206. A base attachment layer 1222 such as a fill, adhesive, or film can be formed between the base device 1218 and the base top side 1208 of the base substrate 1206.

A base encapsulant 1224 can be formed over the device, a portion of the leadframe pillar 1202, and a portion of the base substrate 1206. Components can be covered and protected by the base encapsulant 1224 that can also provide structural integrity particularly with respect to the leadframe pillar 1202. The base encapsulant 1224 can provide the leadframe pillar top 1204 of the leadframe pillar 1202 substantially exposed above the base device 1218.

Base substrate connectors 1226 such as solder balls, solder bumps, or other conductor can be formed over the base bottom side 1210 of the base substrate 1206. The base substrate connectors 1226 can be attached or mounted on the bottom connection regions 1214 to provide electrical connectivity to a next level system such as another package or printed circuit board.

A package interconnect 1228 such as a solder ball, solder bump, or other conductor can provide electrical connectivity to the leadframe pillar 1202 and an electrical component 1230. The electrical component 1230 can be attached or mounted over the leadframe pillar 1202 providing connectivity to the base device 1218 or the base substrate 1206.

Figure 13:
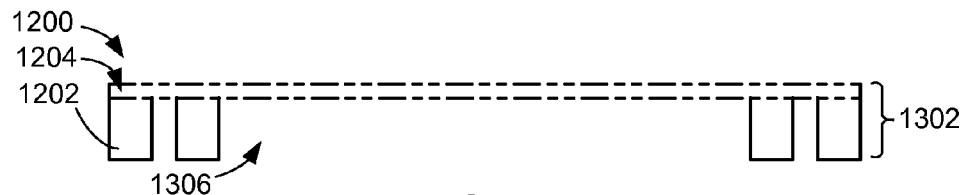
FIG. 13 is a cross-sectional view of the structure of FIG. 12 in an interposer phase.

Referring now to FIG. 13, therein is shown a cross-sectional view of the structure of FIG. 12 in an interposer phase. The integrated circuit packaging system 1200 preferably includes a leadframe 1302 such as an interposer including the leadframe pillar 1202. A cavity 1306 can be formed to provide spacing for the base device 1218 of FIG. 12 or other component.

The leadframe 1302 can be attached or mounted on the base substrate 1206 of FIG. 12 and over the base device 1218 and having the leadframe pillar 1202 adjacent or next to the base device 1218. The leadframe pillar 1202 can preferably be substantially vertical and substantially perpendicular to the base substrate 1206 to provide electrical connectivity from the base top side 1208 to a location above the base device 1218.

A portion of the leadframe 1302 can be removed by a process such as sawing. A removal process can remove a portion of the leadframe 1302 shown as a phantom lines providing the leadframe pillar top 1204 having the physical characteristics of a portion of the leadframe 1302 removed by a removal or saw process.

Figure 14:
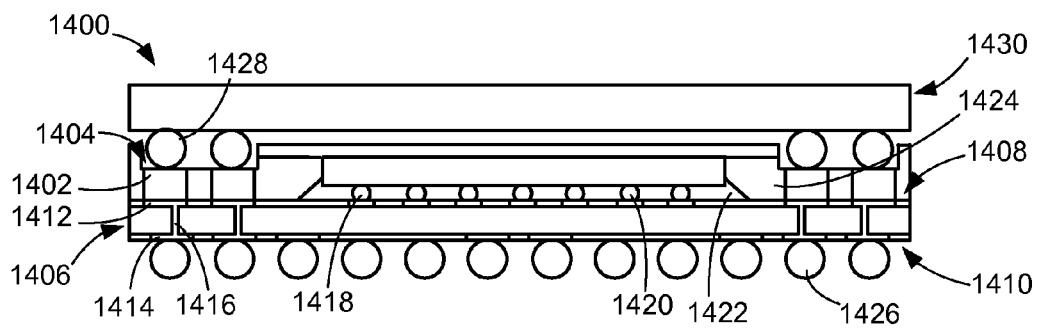
FIG. 14 is a cross-sectional view of an integrated circuit packaging system 1400 in a fourth embodiment of the present invention.

Referring now to FIG. 14, therein is shown a cross-sectional view of an integrated circuit packaging system 1400 in a fourth embodiment of the present invention. The integrated circuit packaging system 1400 preferably includes a leadframe pillar 1402 having a leadframe pillar top 1404. The end opposite the leadframe pillar top 1404 of the leadframe pillar 1402 can be attached or mounted over a base substrate 1406.

The base substrate 1406 can include a base top side 1408 and a base bottom side 1410. Top connection regions 1412 can be formed on or adjacent the base top side 1408. Similarly, bottom connection regions 1414 can be formed on or adjacent the base bottom side 1410. Base substrate interconnects 1416 can provide electrical connectivity between the top connection regions 1412 or the bottom connection regions 1414 or any combination thereof.

A base device 1418 such as an integrated circuit, passive device, or package can be attached or mounted over the base substrate 1406. Base device connectors 1420 can provide electrical connectivity through the top connection regions 1412, the base substrate interconnects 1416, or the bottom connection regions 1414 of the base substrate 1406. A base attachment layer 1422 such as a fill, adhesive, or film can be formed between the base device 1418 and the base top side 1408 of the base substrate 1406.

A base encapsulant 1424 can be formed over the device, a portion of the leadframe pillar 1402, and a portion of the base substrate 1406. Components can be covered and protected by the base encapsulant 1424 that can also provide structural integrity particularly with respect to the leadframe pillar 1402. The base encapsulant 1424 and the leadframe pillar top 1404 of the leadframe pillar 1402 can be substantially exposed below upper extents or a top of the base device 1418.

Base substrate connectors 1426 such as solder balls, solder bumps, or other conductor can be formed over the base bottom side 1410 of the base substrate 1406. The base substrate connectors 1426 can be attached or mounted on the bottom connection regions 1414 to provide electrical connectivity to a next level system such as another package or printed circuit board.

A package interconnect 1428 such as a solder ball, solder bump, or other conductor can provide electrical connectivity to the leadframe pillar 1402 and an electrical component

1430. The electrical component 1430 can be attached or mounted over the leadframe pillar 1402 providing connectivity to the base device 1418 or the base substrate 1406.

Figure 15:
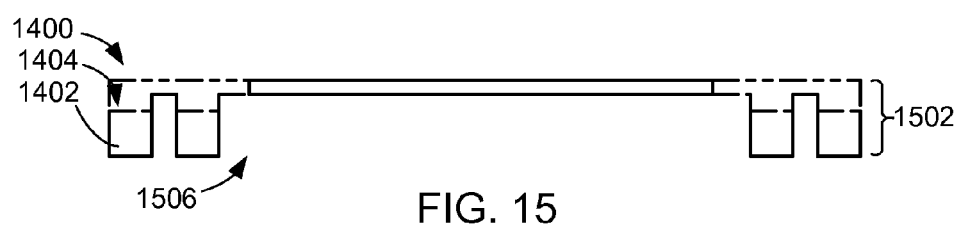
FIG. 15 is a cross-sectional view of the structure of FIG. 14 in an interposer phase.

Referring now to FIG. 15, therein is shown a cross-sectional view of the structure of FIG. 14 in an interposer phase. The integrated circuit packaging system 1400 preferably includes a leadframe 1502 such as an interposer including the leadframe pillar 1402. A cavity 1506 can be formed to provide spacing for the base device 1418 of FIG. 14 or other component.

The leadframe 1502 can be attached or mounted on the base substrate 1406 of FIG. 14 and over the base device 1418 and having the leadframe pillar 1402 adjacent or next to the base device 1418. The leadframe pillar 1402 can preferably be substantially vertical and substantially perpendicular to the base substrate 1406 to provide electrical connectivity from the base top side 1408 to a location above the base device 1418.

A portion of the leadframe 1502 or a portion of the leadframe pillar 1402 can be removed by a process such as grinding. A removal process can partially remove the leadframe 1502 or the leadframe pillar 1402 shown as a phantom lines providing the leadframe pillar top 1404 having the physical characteristics of a portion of the leadframe 1502 removed by a removal or grind process.

Figure 16:
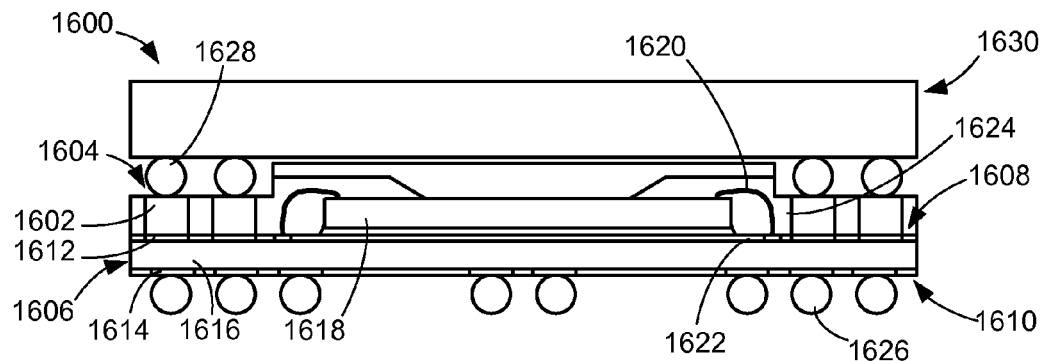
FIG. 16 is a cross-sectional view of an integrated circuit packaging system in a fifth embodiment of the present invention.

Referring now to FIG. 16, therein is shown a cross-sectional view of an integrated circuit packaging system 1600 in a fifth embodiment of the present invention. The integrated circuit packaging system 1600 preferably includes a leadframe pillar 1602 having a leadframe pillar top 1604. The end opposite the leadframe pillar top 1604 of the leadframe pillar 1602 can be attached or mounted over a base substrate 1606.

The base substrate 1606 can include a base top side 1608 and a base bottom side 1610. Top connection regions 1612 can be formed on or adjacent the base top side 1608. Similarly, bottom connection regions 1614 can be formed on or adjacent the base bottom side 1610. Base substrate interconnects 1616 can provide electrical connectivity between the top connection regions 1612 or the bottom connection regions 1614 or any combination thereof.

A base device 1618 such as an integrated circuit, passive device, or package can be attached or mounted over the base substrate 1606. Base device connectors 1620 can provide electrical connectivity through the top connection regions 1612, the base substrate interconnects 1616, or the bottom connection regions 1614 of the base substrate 1606. A base attachment layer 1622 such as a fill, adhesive, or film can be formed between the base device 1618 and the base top side 1608 of the base substrate 1606.

A base encapsulant 1624 can be formed over the device, a portion of the leadframe pillar 1602, and a portion of the base substrate 1606. Components can be covered and protected by the base encapsulant 1624 that can also provide structural integrity particularly with respect to the leadframe pillar 1602. The base encapsulant 1624 and the leadframe pillar top 1604 of the leadframe pillar 1602 can be substantially exposed below or at substantially the same height as upper extents or a top of the base device 1618.

Base substrate connectors 1626 such as solder balls, solder bumps, or other conductor can be formed over the base bottom side 1610 of the base substrate 1606. The base substrate connectors 1626 can be attached or mounted on the bottom connection regions 1614 to provide electrical connectivity to a next level system such as another package or printed circuit board.

A package interconnect 1628 such as a solder ball, solder bump, or other conductor can provide electrical connectivity to the leadframe pillar 1602 and an electrical component 1630. The electrical component 1630 can be attached or mounted over the leadframe pillar 1602 providing connectivity to the base device 1618 or the base substrate 1606.

Figure 17:
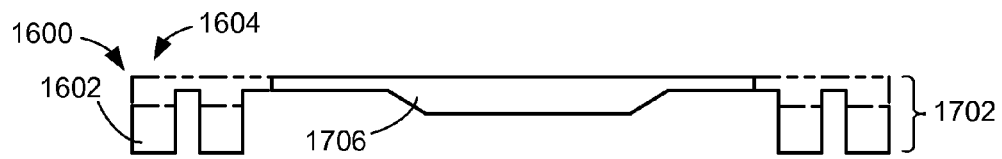
FIG. 17 is a cross-sectional view of the structure of FIG. 16 in an interposer phase.

Referring now to FIG. 17, therein is shown a cross-sectional view of the structure of FIG. 16 in an interposer phase. The integrated circuit packaging system 1600 preferably includes a leadframe 1702 such as an interposer including the leadframe pillar 1602. A protrusion 1706 of the leadframe 1702 can be formed to provide attachment on the base device 1618 of FIG. 16 such as a wire bonding type device or other component.

The leadframe 1702 can be attached or mounted on the base substrate 1606 of FIG. 16 and over the base device 1618 and having the leadframe pillar 1602 adjacent or next to the base device 1618. The leadframe pillar 1602 can preferably be substantially vertical and substantially perpendicular to the base substrate 1606 to provide electrical connectivity from the base top side 1608 to a location above the base device 1618.

A portion of the leadframe 1702 or a portion of the leadframe pillar 1602 can be removed by a process such as grinding. A removal process can partially remove a portion of the leadframe 1702 or the leadframe pillar 1602 shown as a phantom lines providing the leadframe pillar top 1604 having the physical characteristics of a portion of the leadframe 1702 removed by a removal or grind process.

Figure 18:
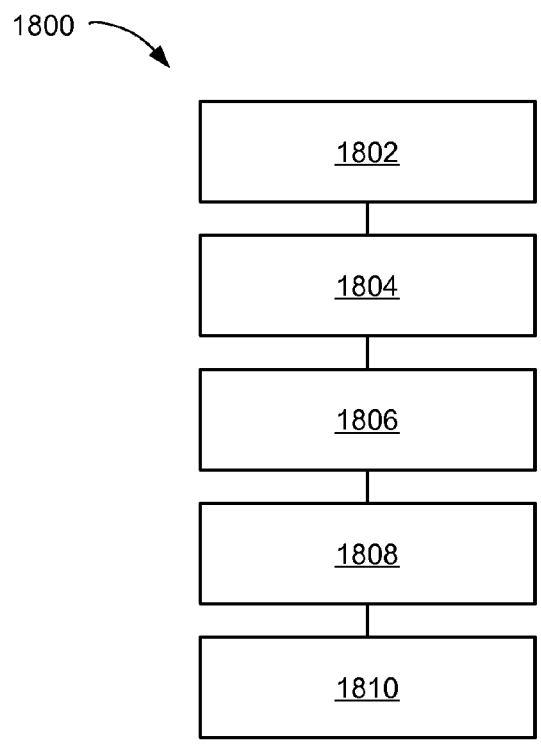
FIG. 18 is flow chart of a method of manufacture of an integrated circuit packaging system in a further embodiment of the present invention.

Referring now to FIG. 18, therein is shown a flow chart of a method 1800 of manufacture of an integrated circuit packaging system in a further embodiment of the present invention. The method 1800 includes providing a base substrate in a block 1802; attaching a base device over the base substrate in a block 1804; attaching a leadframe having a leadframe pillar adjacent the base device over the base substrate in a block 1806; applying a base encapsulant over the base device, the base substrate, and the leadframe in a block 1808; removing a portion of the base encapsulant and a portion of the leadframe providing the leadframe pillar partially exposed in a block 1810.

In greater detail, a system to provide the method and apparatus of the integrated circuit packaging system 100, in an embodiment of the present invention, is performed as follows:

1. Providing a base substrate having a base top side.
2. Attaching a base device over the base top side.
3. Attaching a leadframe having a leadframe pillar adjacent the base device over the base top side.
4. Applying a base encapsulant over the base device, the base top side, and the leadframe.
5. Removing a portion of the base encapsulant and a portion of the leadframe providing a top of the leadframe pillar substantially exposed.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a base substrate;
   attaching a base device over the base substrate;
   attaching a leadframe having a leadframe pillar adjacent the base device over the base substrate;
   applying a base encapsulant over the base device, the base substrate, and co-planar with and extending beyond a perimeter of a leadframe top side of the leadframe; and
   removing a portion of the base encapsulant and a portion of the leadframe providing the leadframe pillar partially exposed.

2. The method as claimed in claim 1 further comprising attaching an electrical component over the leadframe pillar.

3. The method as claimed in claim 1 wherein removing the portion of the leadframe includes forming a top of the leadframe pillar above the base device.

4. The method as claimed in claim 1 wherein removing the portion of the leadframe includes forming a top of the leadframe pillar below a top of the base device.

5. The method as claimed in claim 1 further comprising attaching the leadframe to the base device for thermal dissipation.

6. A method of manufacture of an integrated circuit packaging system comprising:
   providing a base substrate having a base top side;
   attaching a base device over the base top side;
   attaching a leadframe having a leadframe pillar adjacent the base device over the base top side;
   applying a base encapsulant over the base device, the base top side, and co-planar with and extending beyond a perimeter of a leadframe top side of the leadframe; and
   removing a portion of the base encapsulant and a portion of the leadframe providing a top of the leadframe pillar substantially exposed.

7. The method as claimed in claim 6 further comprising attaching an electrical component to the top of the leadframe pillar with a package interconnect.

8. The method as claimed in claim 6 wherein removing the portion of the leadframe includes forming the top of the leadframe pillar above a side of the base device opposite the base substrate.

9. The method as claimed in claim 6 wherein removing the portion of the leadframe includes forming the top of the leadframe pillar below a side of the base device opposite the base substrate.

10. The method as claimed in claim 6 further comprising attaching the leadframe having a protrusion over the base device.

11. An integrated circuit packaging system comprising:
    a base substrate;
    a base device over the base substrate;
    a leadframe pillar, having characteristics of a portion of a leadframe being removed, adjacent the base device over the base substrate; and
    a base encapsulant over the base device, the base substrate, and the leadframe pillar partially exposed.

12. The system as claimed in claim 11 further comprising an electrical component attached over the leadframe pillar.

13. The system as claimed in claim 11 wherein the leadframe pillar includes a top of the leadframe pillar formed above the base device.

14. The system as claimed in claim 11 wherein the leadframe pillar includes a top of the leadframe pillar formed below a top of the base device.

15. The system as claimed in claim 11 further comprising a portion of the leadframe attached to the base device for thermal dissipation.

16. The system as claimed in claim 11 wherein:
    the base substrate has a base top side;
    the base device is over the base top side;
    the leadframe pillar, having characteristics of a portion of the leadframe being removed, is adjacent the base device over the base top side; and
    the base encapsulant is over the base device, the base top side, with a top of the leadframe pillar substantially exposed.

17. The system as claimed in claim 16 further comprising an electrical component attached to the top of the leadframe pillar with a package interconnect.

18. The system as claimed in claim 16 wherein the leadframe pillar includes the top of the leadframe pillar formed above a side of the base device opposite the base substrate.

19. The system as claimed in claim 16 wherein the leadframe pillar includes the top of the leadframe pillar formed below a side of the base device opposite the base substrate.

20. The system as claimed in claim 16 further comprising a portion of the leadframe having a protrusion attached to the base device.

* * * * *